United States Patent
Obata et al.

(10) Patent No.: US 9,953,871 B2
(45) Date of Patent: Apr. 24, 2018

(54) WAFER PROCESSING METHOD

(71) Applicant: DISCO CORPORATION, Tokyo (JP)

(72) Inventors: Tsubasa Obata, Tokyo (JP); Yohei Yamashita, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/341,624

(22) Filed: Nov. 2, 2016

(65) Prior Publication Data

US 2017/0133269 A1    May 11, 2017

(30) Foreign Application Priority Data

Nov. 5, 2015    (JP) ................................. 2015-217275

(51) Int. Cl.
| | |
|---|---|
| *H01L 21/78* | (2006.01) |
| *H01L 21/302* | (2006.01) |
| *H01L 21/304* | (2006.01) |
| *H01L 21/56* | (2006.01) |
| *H01L 21/683* | (2006.01) |
| *H01L 23/31* | (2006.01) |
| *H01L 21/268* | (2006.01) |

(52) U.S. Cl.
CPC ............ *H01L 21/78* (2013.01); *H01L 21/302* (2013.01); *H01L 21/304* (2013.01); *H01L 21/565* (2013.01); *H01L 21/6836* (2013.01); *H01L 23/3114* (2013.01); *H01L 21/268* (2013.01); *H01L 23/3185* (2013.01); *H01L 2221/6834* (2013.01); *H01L 2221/68327* (2013.01)

(58) Field of Classification Search
CPC ............ H01L 21/02002; H01L 23/544; H01L 21/02013
See application file for complete search history.

(56) References Cited

U.S. PATENT DOCUMENTS

| | | | |
|---|---|---|---|
| 2003/0164547 A1* | 9/2003 | Kurita | ..................... H01L 21/56 257/736 |
| 2015/0024575 A1* | 1/2015 | Hu | ........................ H01L 23/544 438/462 |

FOREIGN PATENT DOCUMENTS

JP    2006-100535    4/2006

* cited by examiner

*Primary Examiner* — Mohammad Choudhry

(74) *Attorney, Agent, or Firm* — Greer Burns & Crain, Ltd.

(57) ABSTRACT

A laser beam is applied to the front side of a wafer along division lines, to form grooves having a depth corresponding to a finished thickness of device chips. Molding resin is laid on the front side of the wafer and embedded in the grooves. A protective member is attached to a front side of the molding resin, and a back side of the wafer is ground to expose the grooves and to expose the molding resin embedded in the grooves on the back side of the wafer. The wafer is divided along the grooves by a cutting blade having a thickness smaller than the width of the grooves, a central portion in a width direction of the molding resin being exposed along the grooves, thereby dividing the wafer into individual device chips each having a periphery surrounded with the molding resin.

15 Claims, 14 Drawing Sheets

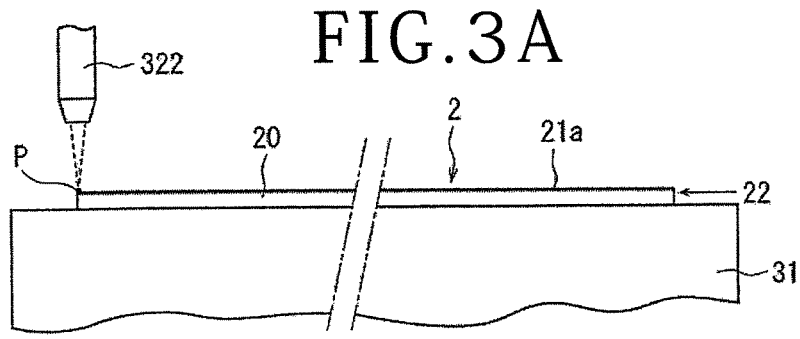
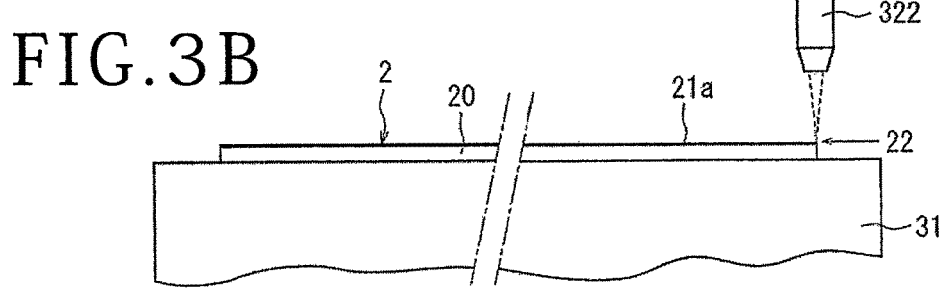
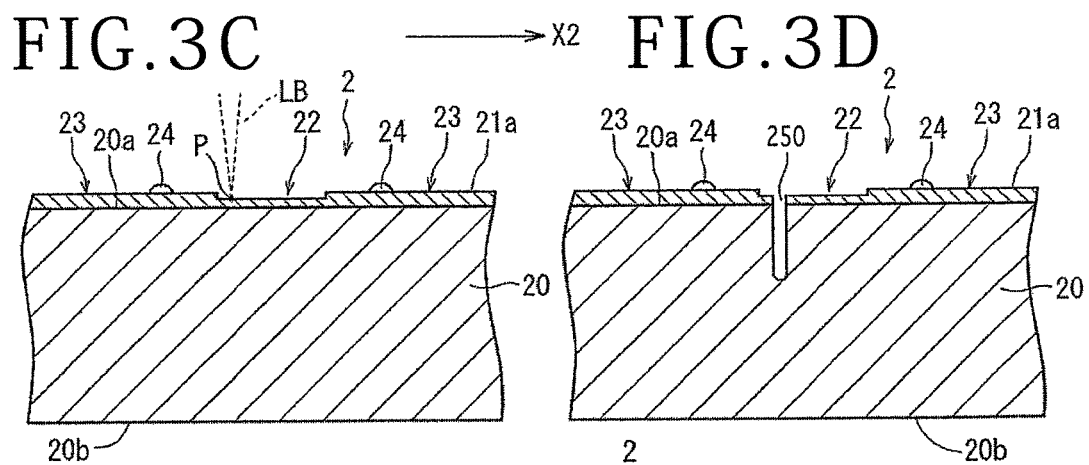
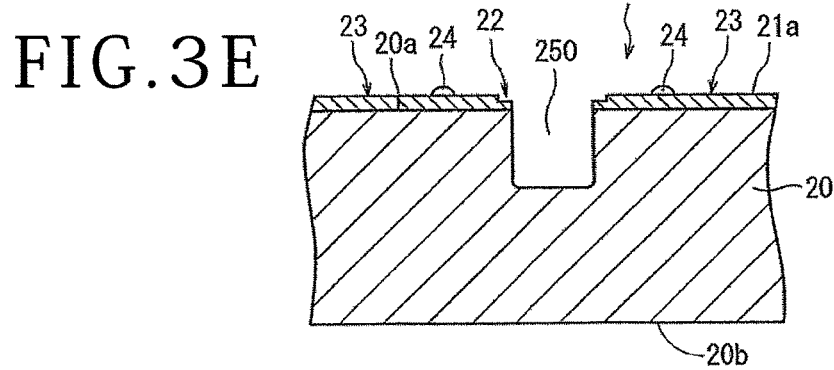

WAFER PROCESSING METHOD

BACKGROUND OF THE INVENTION

Field of the Invention

The present invention relates to a wafer processing method by which a wafer having a plurality of division lines formed on a front side thereof and having devices formed in a plurality of regions partitioned by the division lines is divided along the division lines into individual device chips, and the individual device chips are coated with a resin.

Description of the Related Art

In a semiconductor device manufacturing process, a plurality of regions are partitioned by division lines arranged in a crossing pattern on a front side of a substantially circular disk-shaped semiconductor wafer, and devices such as integrated circuits (ICs) and large scale integrations (LSIs) are formed in the thus partitioned regions. The semiconductor wafer thus formed is cut along the division lines, whereby the regions in which the devices are formed are divided from one another, to produce individual device chips. In recent years, packaging technologies have been developed in which a wafer is divided into individual device chips and the individual device chips are coated with a resin. As one of such packaging technologies, a packaging technology called wafer level chip size package (WL-CSP) is disclosed in Japanese Patent Laid-open No. 2006-100535.

In the packaging technology disclosed in Japanese Patent Laid-open No. 2006-100535, a back side of a wafer is coated with a resin, then cut grooves reaching the resin are formed along division lines from the front side of the wafer, and a molding resin is laid on the front side of the wafer to coat each of the device chips, and the molding resin is embedded in the cut grooves. Thereafter, using a cutting blade having a thickness smaller than the width of the cut grooves, the molding resin embedded in the cut grooves is cut to thereby divide the wafer into individual wafer level chip size packages (WL-CSP).

In addition, in order to enhance the processing capability of semiconductor chips such as ICs and LSIs, a semiconductor wafer has been put to practical use in such a form that a functional layer including a low-permittivity insulator film (low-k film) stacked on a front side of a substrate of silicon or the like constitutes a semiconductor device, the low-k film being composed of an inorganic film of SiOF, BSG (SiOB) or the like or an organic film that is a polymer film of polyimide, parylene or the like. As a wafer processing method for manufacturing wafer level chip size packages (WL-CSP) by use of this type of semiconductor wafer, there has been developed a technology that includes the following steps.

(1) At the time of forming the cut grooves along the division lines from the front side of the wafer, a laser beam is applied to the functional layer along the division lines to form laser-processed grooves and thereby to remove the functional layer along the division lines, such that a breaking force of the cutting blade will not reach the devices formed in the functional layer (functional layer removing step).

(2) By use of a first cutting blade having a thickness smaller than the width of the laser-processed grooves formed along the division lines, cut grooves having a depth corresponding to a finished thickness of device chips are formed along the laser-processed grooves from the front side of the wafer (cut groove forming step).

(3) A molding resin is laid on the front side of the wafer and the molding resin is embedded in the cut grooves (molding step).

(4) A protective member is attached to a front side of the molding resin laid on the front side of the wafer, and the back side of the wafer is ground to expose the cut grooves (back grinding step).

(5) A dicing tape is adhered to the back side of the wafer, and the molding resin embedded in the cut grooves is cut by use of a second cutting blade having a thickness smaller than the width of the cut grooves, to thereby divide the wafer into individual wafer level chip size packages (WL-CSP) (dividing step).

SUMMARY OF THE INVENTION

However, it is difficult for the thickness of the second cutting blade used in performing the above-mentioned dividing step to be set to 20 μm or below. In addition, the width of the division lines is limited. Therefore, the thickness of the first cutting blade is also limited (for example, to 40 μm or below) necessarily, so that the width of the cut grooves formed along the division lines by the first cutting blade is also limited. Accordingly, the width of the molding resin embedded in the cut grooves is insufficient. At the time when the molding resin embedded in the cut grooves is cut by the second cutting blade, the width of the molding resin present between a side surface of the second cutting blade and a side surface of the device chip is as small as approximately 10 μm, and, therefore, there arises a problem in which the device chip side surfaces are damaged and it is difficult to surround the periphery of each device chip by the molding resin.

Accordingly, it is an object of the present invention to provide a wafer processing method by which high-quality device chips each having a periphery surrounded with a molding resin can be obtained, without damaging side surfaces of the device chips.

In accordance with an aspect of the present invention, there is provided a wafer processing method for processing a wafer having a plurality of division lines formed in a crossing pattern on a front side thereof and having devices formed in a plurality of regions partitioned by the division lines, the devices being each provided with a plurality of bumps formed on a front side thereof, the wafer processing method including: a groove forming step of applying a laser beam of such a wavelength as to be absorbed in the wafer from the front side of the wafer along the division lines, to form along the division lines grooves having a depth corresponding to a finished thickness of device chips; a molding step of laying a molding resin on the front side of the wafer having been subjected to the groove forming step and embedding the molding resin in the grooves; a protective member attaching step of attaching a protective member to a front side of the molding resin laid on the front side of the wafer having been subjected to the molding step; a back grinding step of grinding a back side of the wafer having been subjected to the protective member attaching step, to expose the grooves and to expose the molding resin embedded in the grooves to the back side of the wafer; and a dividing step of cutting, by a cutting blade having a thickness smaller than a width of the grooves, a central portion in a width direction of the molding resin exposed along the grooves, along the grooves, thereby to divide the wafer into individual device chips each having a periphery surrounded with the molding resin.

Preferably, the dividing step includes cutting the central portion in the width direction of the molding resin exposed along the grooves by the cutting blade along the grooves from the back side of the wafer. Preferably, a wafer supporting step of attaching the back side of the wafer having been subjected to the back grinding step to a front side of a dicing tape an outer peripheral portion of which is mounted such as to cover an inside opening of an annular frame, and releasing the protective member attached to the front side of the molding resin laid on the front side of the wafer, is performed before carrying out the dividing step.

In accordance with another aspect of the present invention, there is provided a wafer processing method for processing a wafer having a plurality of division lines formed in a crossing pattern on a front side thereof and having devices formed in a plurality of regions partitioned by the division lines, the devices being each provided with a plurality of bumps formed on a front side thereof, the wafer processing method including: a groove forming step of applying a laser beam having such a wavelength as to be absorbed in the wafer from the front side of the wafer along the division lines, to form along the division lines grooves having a depth corresponding to a finished thickness of device chips; a molding step of laying a molding resin on the front side of the wafer having been subjected to the groove forming step and embedding the molding resin in the grooves; a cut groove forming step of cutting, by a cutting blade having a thickness smaller than a width of the grooves, a central portion in a width direction of the molding resin laid on the front side of the wafer having been subjected to the molding step and of the molding resin embedded in the grooves, along the grooves from the front side of the wafer, to form cut grooves having a depth corresponding to the finished thickness of the device chips; a protective member attaching step of attaching a protective member to a front side of the molding resin laid on the front side of the wafer having been subjected to the cut groove forming step; and a back grinding step of grinding a back side of the wafer having been subjected to the protective member attaching step, to expose the molding resin embedded in the grooves and the cut grooves to the back side of the wafer and thereby to divide the wafer into individual device chips each having a periphery surrounded with the molding resin.

Preferably, the wafer processing method further includes, before the dividing step, a wafer supporting step of attaching the back side of the wafer having been subjected to the back grinding step to a front side of a dicing tape an outer peripheral portion of which is mounted such as to cover an inside opening of an annular frame, and releasing the protective member attached to the front side of the molding resin laid on the front side of the wafer.

According to the first aspect of the wafer processing method of the present invention, it is possible in the groove forming step to apply the laser beam to a functional layer along the division lines (80 μm in width) to form laser-processed grooves, thereby removing the functional layer along the division lines and thereafter forming wide grooves which reach a depth corresponding to the finished thickness of the device chips. Therefore, where a central portion in the width direction of the molding resin exposed along the grooves in the wafer is cut along the grooves by a cutting blade having a thickness smaller than the width of the grooves, in the dividing step, the wafer can be divided into the individual device chips each having a periphery surrounded with the molding resin, without damaging side surfaces of the device chips even when a cutting blade limited in width to a value of not less than 20 μm is used.

According to the second aspect of the wafer processing method of the present invention, it is possible, by application of the laser beam in the groove forming step, to form grooves greater in width than the cut grooves formed to have a depth corresponding to the finished thickness of the device chips. Therefore, in the cut groove forming step, a central portion in the width direction of the molding resin laid on the front side of the wafer and the molding resin embedded in the grooves can be cut along the grooves by a cutting blade having a thickness smaller than the width of the grooves to thereby form cut grooves having a thickness corresponding to the finished thickness of the device chips, without damaging side surfaces of the device chips even when a cutting blade limited in width to a value of not less than 20 μm is used.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 3A to 3E are illustrations of the groove forming step.

DETAILED DESCRIPTION OF THE PREFERRED EMBODIMENTS

Figure 1A:
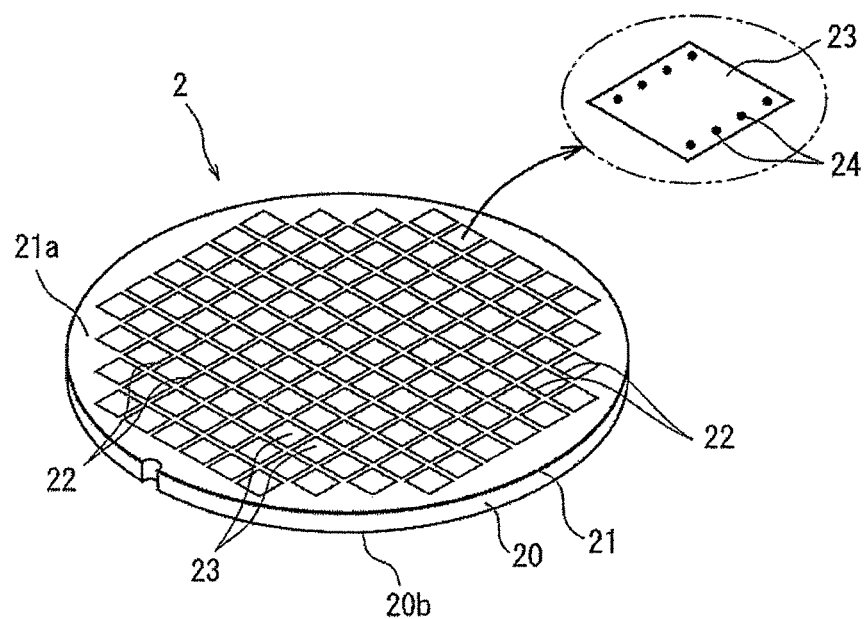
FIG. 1A is a perspective view of a semiconductor wafer.
Figure 1B:
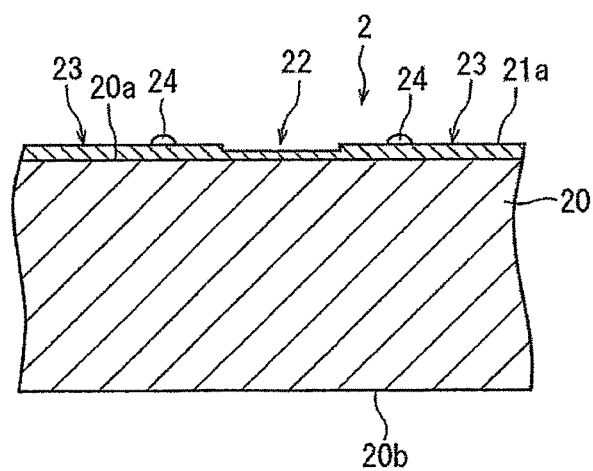
FIG. 1B is a sectional view showing a major part of the semiconductor wafer in an enlarged state.

Some preferred embodiments of the wafer processing method according to the present invention will be described in detail below, referring to the attached drawings. FIGS. 1A and 1B are a perspective view and a major part enlarged sectional view of a semiconductor wafer to be processed by the wafer processing method according to the present invention. The semiconductor wafer 2 is provided with a functional layer 21 on a front side 20a of a substrate 20 formed of silicon or the like and having a diameter of 200 mm and a thickness of 400 μm, the functional layer 21 being formed by stacking an insulation film and a functional film for forming circuits. The thickness of the functional layer 21 is set to 10 μm. The insulation film constituting the functional layer 21 is composed of a low-permittivity insulator film (low-k film) consisting of a $SiO_2$ film, an inorganic film of SiOF, BSG (SiOB) or the like or an organic film which is a polymer film of polyimide, parylene or the like. The functional layer 21 formed in this way is formed with a plurality of division lines 22 in a crossing pattern, and devices 23 such as ICs and LSIs are formed in a plurality of regions partitioned by the division lines 22. Note that the width of the division lines 22 is set to 80 µm, and the devices 23 are all the same in configuration. Each of the devices 23 is formed at a front side thereof with a plurality of bumps 24 which are electrodes. A wafer processing method for dividing the semiconductor wafer 2 along the division lines 22 into individual chips including the devices 23 and coating each of the device chips with a resin will now be described below.

Figure 2:
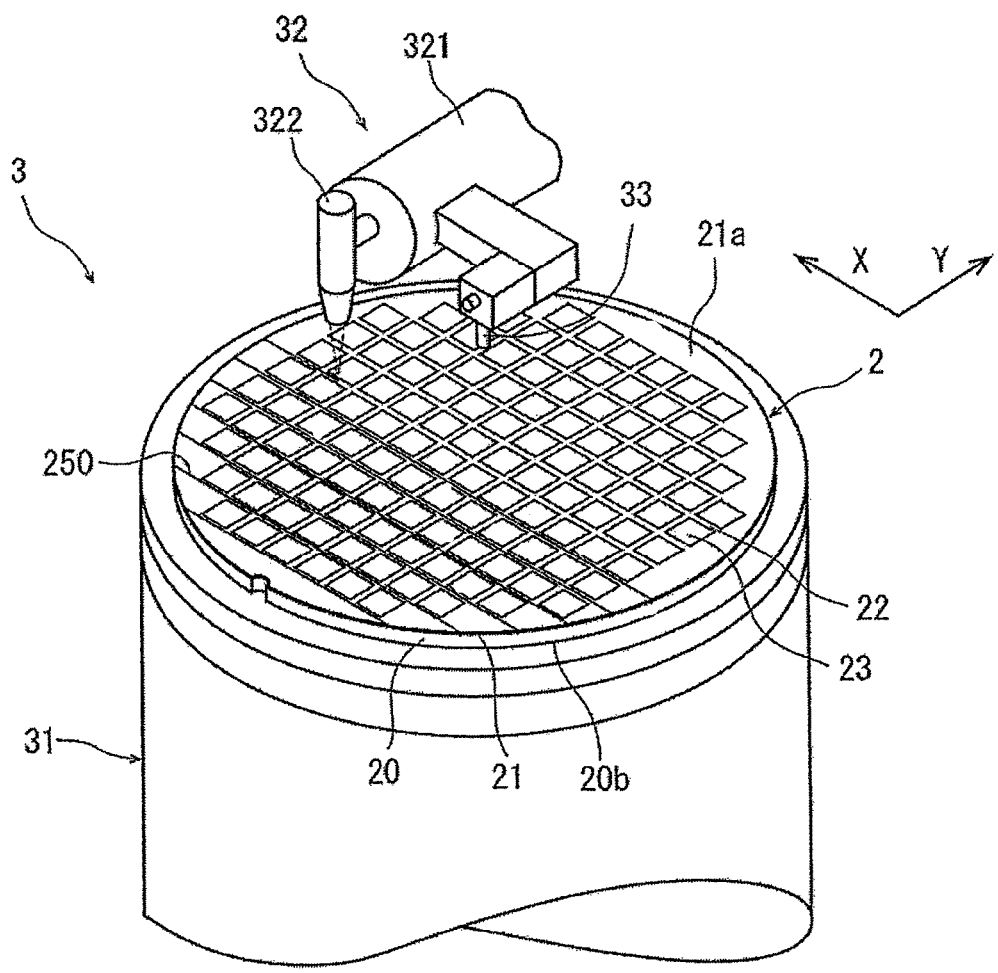
FIG. 2 is a major part perspective view of a cutting apparatus for performing a groove forming step.

In a first embodiment of the wafer processing method, first, a groove forming step is carried out in which a laser beam having such a wavelength as to be absorbed in the wafer is applied from the front side of the wafer along the division lines, to form along the division lines grooves which have a depth corresponding to a finished thickness of the device chips. The groove forming step is carried out by use of a laser processing apparatus 3 depicted in FIG. 2. The laser processing apparatus 3 shown in FIG. 2 includes a chuck table 31 for holding a workpiece, laser beam applying means 32 for applying a laser beam to the workpiece held on the chuck table 31, and imaging means 33 for imaging the workpiece held on the chuck table 31. The chuck table 31 is configured to hold the workpiece by suction, and is configured to be moved by processing feeding means (not shown) in a processing feed direction indicated by arrow X in FIG. 2 and be moved by indexing feeding means (not shown) in an indexing feed direction indicated by arrow Y in FIG. 2.

The laser beam applying means 32 includes a hollow cylindrical casing 321 disposed substantially horizontally. Inside the casing 321 is disposed pulsed laser beam oscillating means (not shown) provided with a pulsed laser oscillator and repetition frequency setting means. At a tip portion of the casing 321, there is mounted focusing means 322 for focusing a pulsed laser beam oscillated from the pulsed laser beam oscillating means. Note that the laser beam applying means 32 is provided with focal point position adjusting means for adjusting a focal point position of the pulsed laser beam focused by the focusing means 322.

The imaging means 33 mounted at the tip portion of the casing 321 constituting the laser beam applying means 32 includes illuminating means for illuminating the workpiece, an optical system for catching a region illuminated by the illuminating means, an imaging device (charge coupled device (CCD)) for picking up an image caught by the optical system, and the like, and an image signal obtained by the image pick-up is sent to control means (not shown).

The groove forming step of applying the laser beam of such a wavelength as to be absorbed in the wafer from the front side of the wafer along the division lines, to form along the division lines the grooves having the depth corresponding to the finished thickness of the device chips, by use of the above-mentioned laser processing apparatus 3, will be described referring to FIG. 2 and FIGS. 3A to 3E. First, the substrate 20 constituting the semiconductor wafer 2 is mounted on the chuck table 31 of the laser processing apparatus 3 shown in FIG. 2, with its back side 20b facing down. Then, suction means (not shown) is operated, to thereby hold the semiconductor wafer 2 on the chuck table 31 (wafer holding step). Therefore, of the semiconductor wafer 2 held on the chuck table 31, a front side 21a of the functional layer 21 is situated on the upper side. The chuck table 31 with the semiconductor wafer 2 held thereon by suction in this way is positioned into a position just under the imaging means 33 by the processing feeding means (not shown).

After the chuck table 31 is positioned just beneath the imaging means 33, an alignment operation in which a processing region to be laser processed of the semiconductor wafer 2 is detected by the imaging means 33 and the control means (not shown) is conducted. Specifically, the imaging means 33 and the control means (not shown) carry out image processing such as pattern matching for positional matching between the division line 22 formed in a predetermined direction of the semiconductor wafer 2 and the focusing means 322 of the laser beam applying means 32 for applying the laser beam along the division line 22, to perform alignment of a laser beam applying position (alignment step). In addition, alignment of the laser beam applying position is carried out in the same manner also for the division line 22 formed on the semiconductor wafer 2 in a direction orthogonal to the predetermined direction.

After the alignment step as above is performed, the chuck table 31 is moved into the laser beam applying region in which the focusing means 322 of the laser beam applying means 32 for applying the laser beam is located, and the predetermined division line 22 is positioned just under the focusing means 322, as shown in FIG. 3A. In this instance, as illustrated in FIG. 3A, the semiconductor wafer 2 is positioned in such a manner that one end (the left end in FIG. 3A) of the division line 22 is positioned just under the focusing means 322. Then, as depicted in FIG. 3C, a focal point P of a pulsed laser beam LB applied from the focusing means 322 is adjusted to the vicinity of a front side at a position spaced by 15 µm from the left end in the width direction of the division line 22. Next, while the pulsed laser beam LB having such a wavelength as to be absorbed in the semiconductor wafer 2 is being applied from the focusing means 322 of the laser beam applying means 32, the chuck table 31 is moved at a predetermined processing feed speed in the direction indicated by arrow X1 in FIG. 3A. Then, when the other end (the right end in FIG. 3B) of the division line 22 has reached the position just beneath the focusing means 322 as depicted in FIG. 3B, the application of the pulsed laser beam LB is stopped, and the movement of the chuck table 31 is stopped (groove forming step). This groove forming step, in the embodiment illustrated, is conducted under the following processing conditions.

Wavelength of laser beam: 355 nm
Pulse width: 5 ns
Repetition frequency: 40 kHz
Power: 4 W
Focused spot diameter: 20 µm
Processing feed speed: 200 mm/second With the groove forming step conducted under the above-mentioned processing conditions, the semiconductor wafer 2 is formed along the division line 22 with a laser-processed groove 250 which divides the functional layer 21, reaches the substrate 20, and has a width of 10 µm and a depth (100 µm) corresponding to the finished thickness of device chips, as illustrated in FIG. 3D.

Next, the chuck table 31 is moved, by 10 µm in this embodiment, in a direction (indexing feed direction) perpendicular to the paper surface in FIG. 3B. Then, while the pulsed laser beam LB is being applied from the focusing means 322 of the laser beam applying means 32, the chuck table 31 is moved at a predetermined processing feed speed in a direction indicated by arrow X2 in FIG. 3B, and, when the positional situation depicted in FIG. 3A is reached, the application of the pulsed laser beam LB is stopped, and the movement of the chuck table 31 is stopped. This groove forming step is carried out three times (three reciprocations) for each division line 22, thereby forming along the division line 22 a laser-processed groove 250 which has a width of 60 μm, divides the functional layer 21, and has a depth (100 μm) corresponding to the finished thickness of the device chips, as illustrated in FIG. 3E. In this way, the groove forming step is carried out along all the division lines 22 formed in the semiconductor wafer 2.

Thus, in the groove forming step, since the laser-processed groove 250 having the depth (100 μm) corresponding to the finished thickness of the device chips is formed by applying the laser beam LB along the division line 22, the laser-processed groove 250 having a width of 60 μm can be formed along the division line 22 having a width of 80 μm.

Figure 4A:
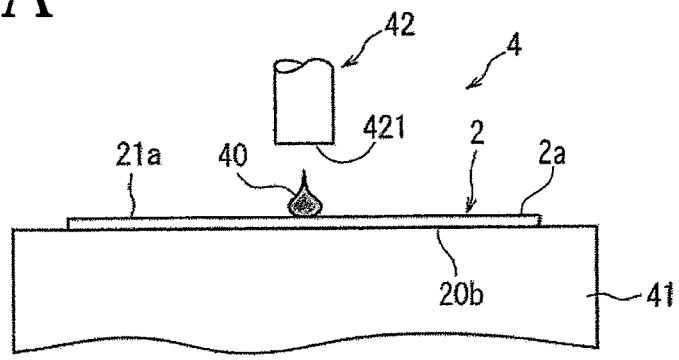
FIGS. 4A to 4C are illustrations of a molding step.

After the groove forming step as above is conducted, a molding step is carried out for laying a molding resin on the front side of the semiconductor wafer 2 and embedding the molding resin in the laser-processed grooves 250. In the molding step, as shown in FIG. 4A, the semiconductor wafer 2 having undergone the above-mentioned groove forming step is placed on a holding surface which is an upper surface of a holding table 41 of a resin coating apparatus 4 in such a manner that the back side 20b of the substrate 20 constituting the semiconductor wafer 2 faces down. Then, suction means (not shown) is operated, to thereby hold the semiconductor wafer 2 on the holding surface of the holding table 41 by suction. Therefore, of the semiconductor wafer 2 held on the holding table 41, the front side 21a of the functional layer 21 is situated on the upper side. After the semiconductor wafer 2 is thus held on the holding table 41, a jet port 421 of a resin supplying nozzle 42 is positioned to a central portion of the semiconductor wafer 2 held on the holding table 41 as shown in FIG. 4A, and resin supplying means (not shown) is operated, whereby a predetermined amount of a molding resin 40 is dropped from the jet port 421 of the resin supplying nozzle 42 into a central region of the front side 21a of the functional layer 21 of the semiconductor wafer 2 held on the holding table 41.

Figure 4B:
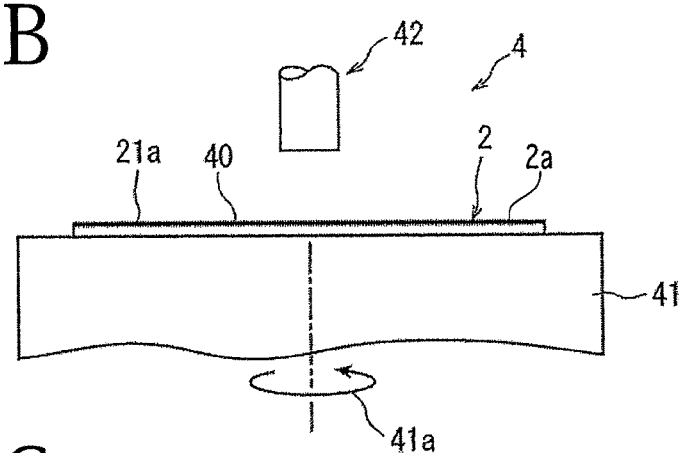
Figure 4C:
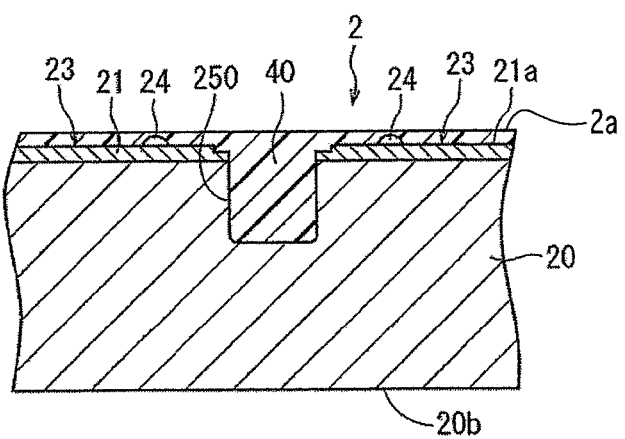

After the predetermined amount of the molding resin 40 was dropped into the central region of the front side 21a of the functional layer 21 of the semiconductor wafer 2, the holding table 41 is rotated for a predetermined time at a predetermined rotating speed in a direction indicated by arrow 41a as shown in FIG. 4B, whereby the molding resin 40 is laid on the front side 21a of the functional layer 21 of the semiconductor wafer 2, and the molding resin 40 is embedded in the laser-processed grooves 250, as illustrated in FIGS. 4B and 4C. Note that a thermosetting liquid resin (epoxy resin) is used as the molding resin 40 in this embodiment, and is cured by heating at approximately 150° C. after being laid on the front side 2a of the semiconductor wafer 2 and embedded in the laser-processed grooves 250.

Next, a bump exposing step is performed in which the molding resin 40 laid on the front side 21a of the functional layer 21 of the semiconductor wafer 2 is polished, to expose the bumps 24 formed on the front side of the devices 23. The bump exposing step is carried out by use of a polishing apparatus 5 depicted in FIG. 5A. The polishing apparatus 5 shown in FIG. 5A includes a chuck table 51 for holding a workpiece, and polishing means 52 for polishing the workpiece held on the chuck table 51. The chuck table 51 is configured to hold the workpiece on its upper surface by suction, and is rotated by a rotational driving mechanism (not shown) in a direction indicated by arrow 51a in FIG. 5A. The polishing means 52 includes a spindle housing 521, a spindle 522 which is rotatably supported by the spindle housing 521 and is rotated by a rotational driving mechanism (not shown), a mounter 523 mounted to a lower end of the spindle 522, and a polishing tool 524 mounted to a lower surface of the mounter 523. The polishing tool 524 includes a circular base 525, and a polishing pad 526 mounted to a lower surface of the base 525, and the base 525 is mounted to the lower surface of the mounter 523 by fastening bolts 527. Note that the polishing pad 526 has a felt in which silica abrasive grains are mixed as abrasive.

Figure 5A:
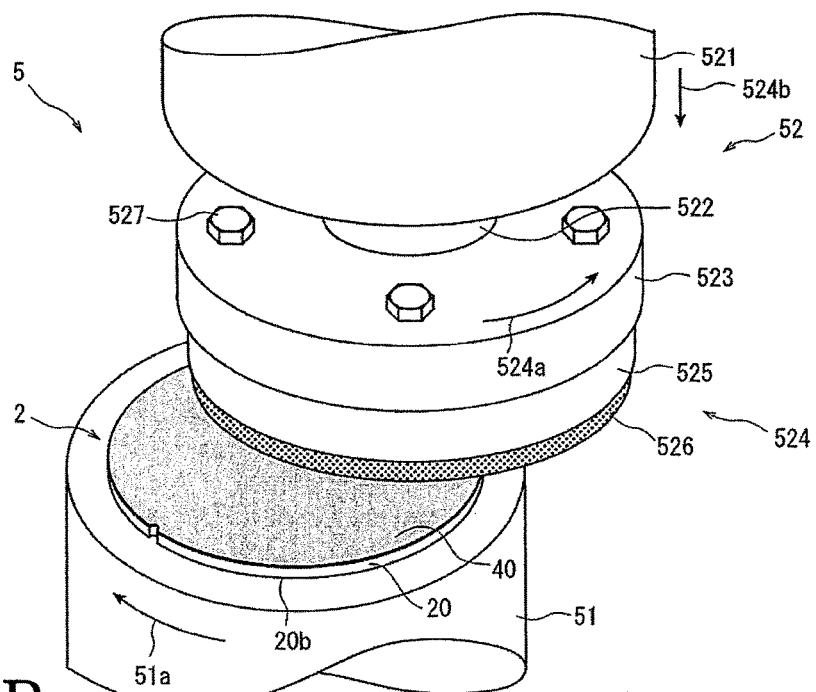
FIGS. 5A to 5C are illustrations of a bump exposing step.
Figure 5B:
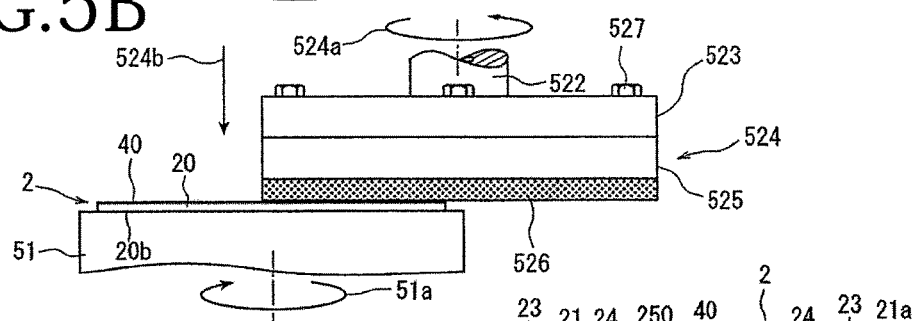
Figure 5C:
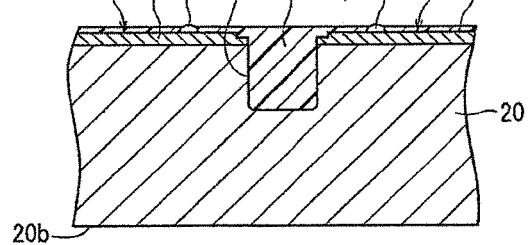

In carrying out the bump exposing step by use of the polishing apparatus 5, the substrate 20 constituting the semiconductor wafer 2 having been subjected to the molding step is placed on an upper surface (holding surface) of the chuck table 51, with its back side 20b facing down, as shown in FIG. 5A. Then, suction means (not shown) is operated, to thereby hold the semiconductor wafer 2 on the chuck table 51 by suction (wafer holding step). Therefore, of the semiconductor wafer 2 held on the chuck table 51, the molding resin 40 laid on the front side 21a of the functional layer 21 is situated on the upper side. After the semiconductor wafer 2 is suction held on the chuck table 51 in this manner, the chuck table 51 is rotated at a predetermined rotating speed in a direction indicated by arrow 51a in FIG. 5A. Under this condition, the polishing tool 524 of the polishing means 52 is rotated at a predetermined rotating speed in a direction indicated by arrow 524a in FIG. 5A, the polishing pad 526 is brought into contact with an upper surface of the molding resin 40 laid on the front side 21a of the functional layer 21 of the semiconductor wafer 2 that constitutes a surface to be processed, as depicted in FIG. 5B, and the polishing tool 524 is put to polishing feed by a predetermined amount downward (in a direction perpendicular to the holding surface of the chuck table 51) at a predetermined polishing feed rate as indicated by arrow 524b in FIGS. 5A and 5B. As a result, the molding resin 40 laid on the front side 21a of the functional layer 21 of the semiconductor wafer 2 is polished, whereby the bumps 24 formed at the front side of the devices 23 are exposed, as illustrated in FIG. 5C. Note that the bump exposing step as above may not necessarily be performed in the case where the molding resin 40 is laid on the front side 21a of the functional layer 21 of the semiconductor wafer 2 without covering the bumps 24 in the above-mentioned molding step.

Figure 6A:
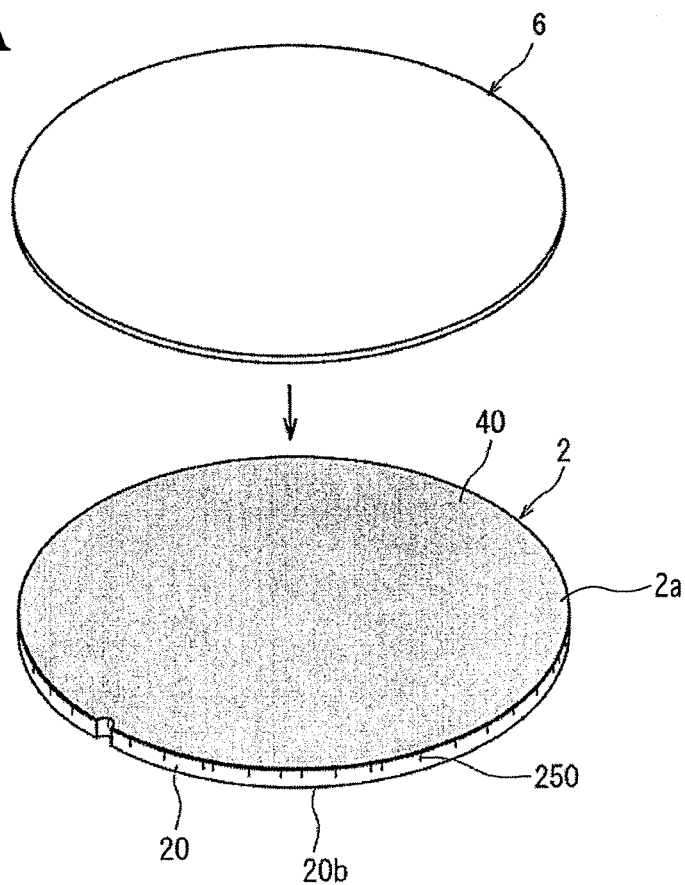
FIGS. 6A and 6B are illustrations of a protective member attaching step.
Figure 6B:
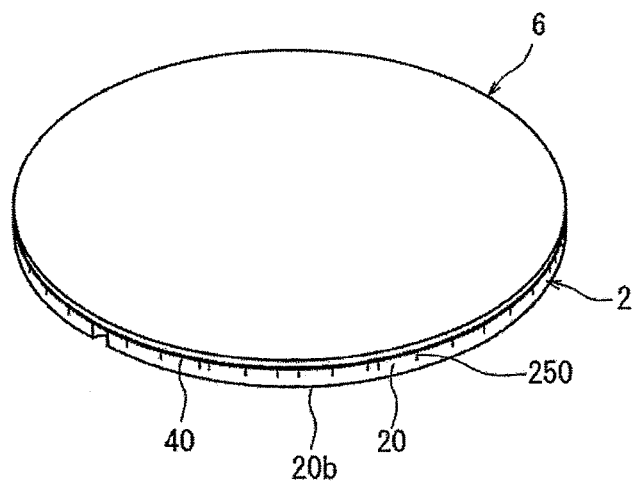

After the bump exposing step as above is conducted, a protective member attaching step is carried out in which a protective member is attached to a front side of the molding resin 40 laid on the front side 21a of the functional layer 21 of the semiconductor wafer 2. Specifically, as shown in FIGS. 6A and 6B, a protective tape 6 as a protective member is attached to the front side of the molding resin 40 laid on a front side 2a of the semiconductor wafer 2. Note that the protective tape 6 in this embodiment has an acrylic resin adhesive applied in a thickness of approximately 5 μm to a front side of a sheet-shaped base material of polyvinyl chloride (PVC) having a thickness of 100 μm.

Subsequently, a back grinding step is conducted in which the back side 20b of the substrate 20 constituting the semiconductor wafer 2 having undergone the protective member attaching step is ground, to expose the laser-processed grooves 250 and to expose the molding resin 40 embedded in the laser-processed grooves 250 to the back side 20b of the substrate 20 constituting the semiconductor wafer 2. The back grinding step is carried out by use of a grinding apparatus 7 depicted in FIG. 7A. The grinding apparatus 7 shown in FIG. 7A includes a chuck table 71 for holding a workpiece, and grinding means 72 for grinding the workpiece held on the chuck table 71. The chuck table 71 is configured to hold the workpiece on its upper surface constituting a holding surface by suction, and is rotated by a rotational driving mechanism (not shown) in a direction indicated by arrow 71a in FIG. 7A. The grinding means 72 includes a spindle housing 721, a spindle 722 which is rotatably supported on the spindle housing 721 and is rotated by a rotational driving mechanism (not shown), a mounter 723 mounted to a lower end of the spindle 722, and a grinding wheel 724 mounted to a lower surface of the mounter 723. The grinding wheel 724 includes a circular annular base 725, and grindstones 726 mounted to a lower surface of the base 725 in an annular pattern, the base 725 being mounted to the lower surface of the mounter 723 by fastening bolts 727.

Figure 7A:
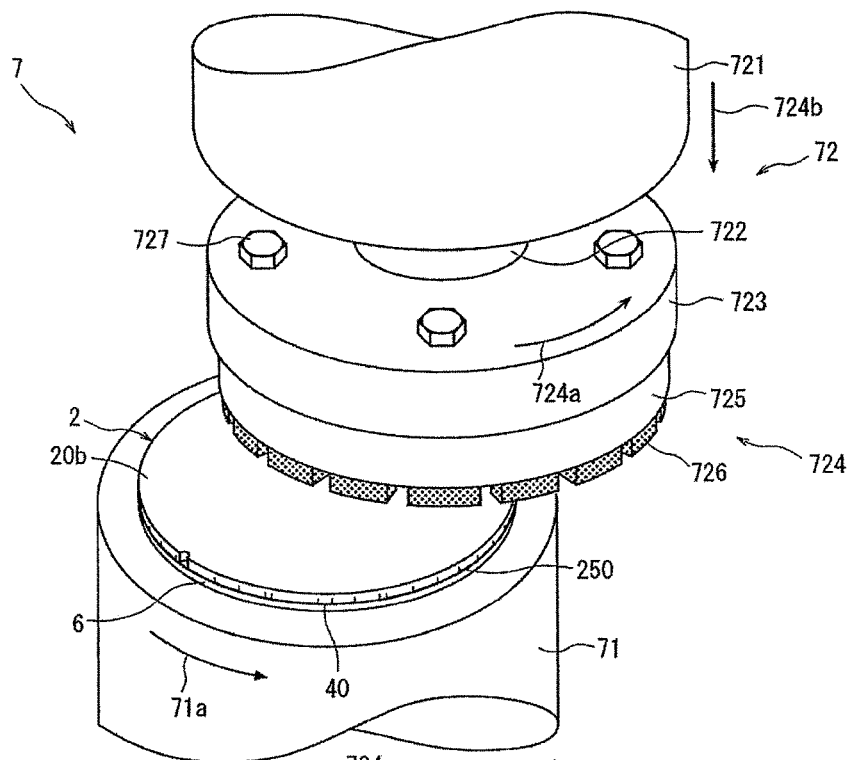
FIGS. 7A to 7C are illustrations of a back grinding step.
Figure 7B:
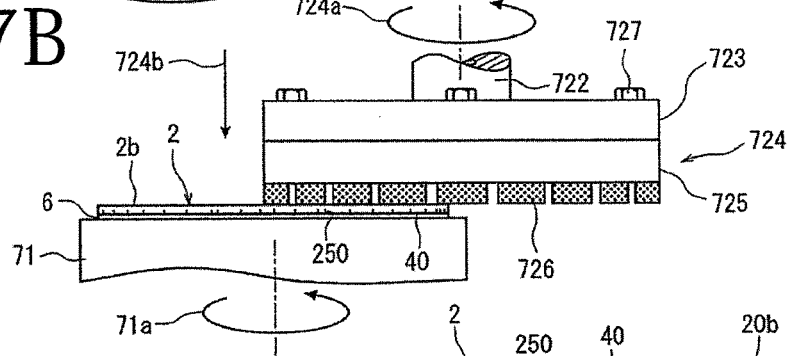
Figure 7C:
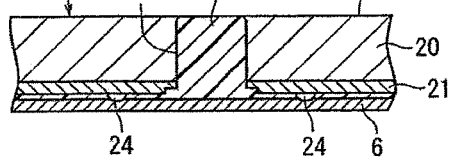

In carrying out the back grinding step by use of the grinding apparatus 7 as above, the semiconductor wafer 2 having been subjected to the protective member attaching step is placed on the upper surface (holding surface) of the chuck table 71, with its protective tape 6 side facing down, as illustrated in FIG. 7A. Then, suction means (not shown) is operated, to thereby suction hold the semiconductor wafer 2 on the chuck table 71 through the protective tape 6. Therefore, of the semiconductor wafer 2 held on the chuck table 71, the back side 20b of the substrate 20 is situated on the upper side. After the semiconductor wafer 2 is thus suction held on the chuck table 71 through the protective tape 6, the chuck table 71 is rotated, for example, at 300 rpm in the direction indicated by arrow 71a in FIG. 7A, Under this condition, the grinding wheel 724 of the grinding means 72 is rotated, for example, at 6,000 rpm in a direction indicated by arrow 724a in FIG. 7A, the grindstones 726 are brought into contact with the back side 20b of the substrate 20 constituting the semiconductor wafer 2 that is a surface to be processed, as shown in FIG. 7B, and the grinding wheel 724 is put to grinding feed by a predetermined amount downward (in a direction perpendicular to the holding surface of the chuck table 71) at a grinding feed rate of, for example, 1 µm/second, as indicated by arrow 724b in FIGS. 7A and 7B. As a result, the back side 20b of the substrate 20 constituting the semiconductor wafer 2 is ground, whereby the laser-processed grooves 250 are exposed to the back side 20b of the substrate 20 constituting the semiconductor wafer 2, and the molding resin 40 embedded in the laser-processed grooves 250 are exposed to the back side 20b of the substrate 20 constituting the semiconductor wafer 2 as shown in FIG. 7C.

After the back grinding step as above is conducted, a dividing step is carried out in which a central portion in the width direction of the molding resin 40 exposed along the laser-processed grooves 250 is cut along the laser-processed grooves 250 by a cutting blade having a thickness smaller than the width of the laser-processed grooves 250, to divide the semiconductor wafer 2 into individual device chips each having a periphery surrounded with the molding resin 40. This dividing step, in this embodiment, is carried out by use of a cutting apparatus 8 depicted in FIG. 8. The cutting apparatus 8 shown in FIG. 8 includes a chuck table 81 for holding a workpiece, cutting means 82 for cutting the workpiece held on the chuck table 81, and imaging means 83 for imaging the workpiece held on the chuck table 81. The chuck table 81 is configured to hold the workpiece by suction, and is configured to be moved by cutting feeding means (not shown) in a cutting feed direction indicated by arrow X in FIG. 8 and be moved by indexing feeding means (not shown) in an indexing feed direction indicated by arrow Y in FIG. 8.

The cutting means 82 includes a spindle housing 821 disposed substantially horizontally, a spindle 822 rotatably supported by the spindle housing 821, and a cutting blade 823 which is mounted to a tip portion of the spindle 822 and has an annular cutting edge 823a, and the spindle 822 is rotated in a direction indicated by arrow 822a by a servo motor (not shown) disposed inside the spindle housing 821. Note that the thickness of the annular cutting edge 823a of the cutting blade 823 is set to 20 µm in this embodiment. The imaging means 83 includes optical means such as a microscope and a CCD camera, and sends to control means (not shown) an image signal obtained upon imaging.

In carrying out the dividing step by use of the cutting apparatus 8 as above, the semiconductor wafer 2 having been subjected to the back grinding step is placed on the chuck table 81, with its protective tape 6 side facing down. Then, suction means (not shown) is operated, to thereby suction hold the semiconductor wafer 2 on the chuck table 81 through the protective tape 6. Therefore, of the semiconductor wafer 2 held on the chuck table 81, the back side 20b of the substrate 20 is situated on the upper side. The chuck table 81 with the semiconductor wafer 2 suction held thereon in this manner is positioned into a position just under the imaging means 83 by the cutting feeding means (not shown).

After the chuck table 81 is positioned just beneath the imaging means 83, an alignment operation in which a cutting region to be cut of the molding resin 40 embedded in the laser-processed grooves 250 formed in the substrate 20 constituting the semiconductor wafer 2 is detected by the imaging means 83 and the control means (not shown) is performed. Specifically, the imaging means 83 and the control means (not shown) perform image processing for positional matching between the molding resin 40 embedded in the laser-processed groove 250 formed in a first direction of the substrate 20 constituting the semiconductor wafer 2 and the cutting blade 823, and perform alignment of the cutting region (alignment step). In addition, the alignment of the cutting region is conducted in the same manner also for the molding resin 40 embedded in the laser-processed groove 250 formed in a second direction orthogonal to the first direction of the substrate 20 constituting the semiconductor wafer 2. In this alignment step, since the molding resin 40 embedded in the laser-processed groove 250 is exposed to the back side 20b of the substrate 20 constituting the semiconductor wafer 2, the molding resin 40 embedded in the laser-processed groove 250 can be clearly detected by the imaging means 83.

After the alignment of the cutting region of the semiconductor wafer 2 held on the chuck table 81 is conducted in this way, the chuck table 81 holding the semiconductor wafer 2 thereon is moved to a cutting starting position of the cutting region. In this instance, as illustrated in FIG. 9A, the semiconductor wafer 2 is positioned in such a manner that one end (the left end in FIG. 9A) of the molding resin 40 embedded in the laser-processed groove 250 to be cut is positioned at a position spaced by a predetermined amount to the right side from a position just under the annular cutting edge 823a of the cutting blade 823, and a center in the width direction of the molding resin 40 embedded in the laser-processed groove 250 is positioned at a position corresponding to the cutting blade 823.

Figure 9A:
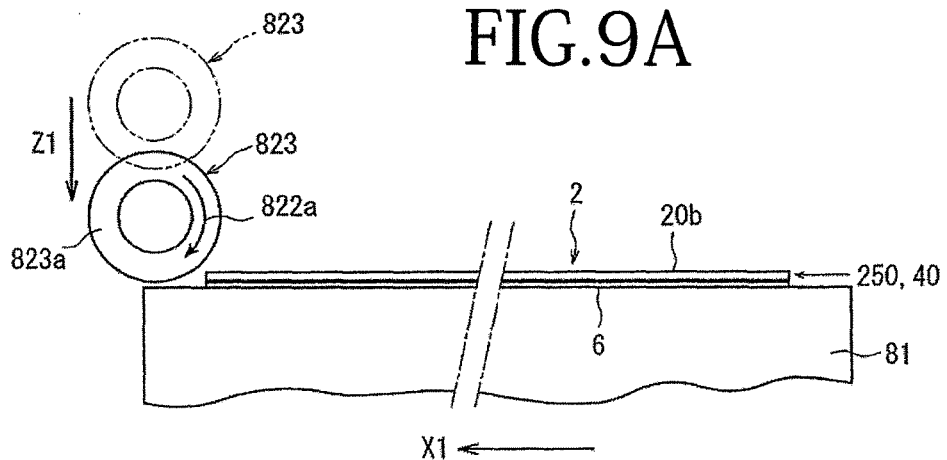
FIGS. 9A to 9D are illustrations of the dividing step.
Figure 9B:
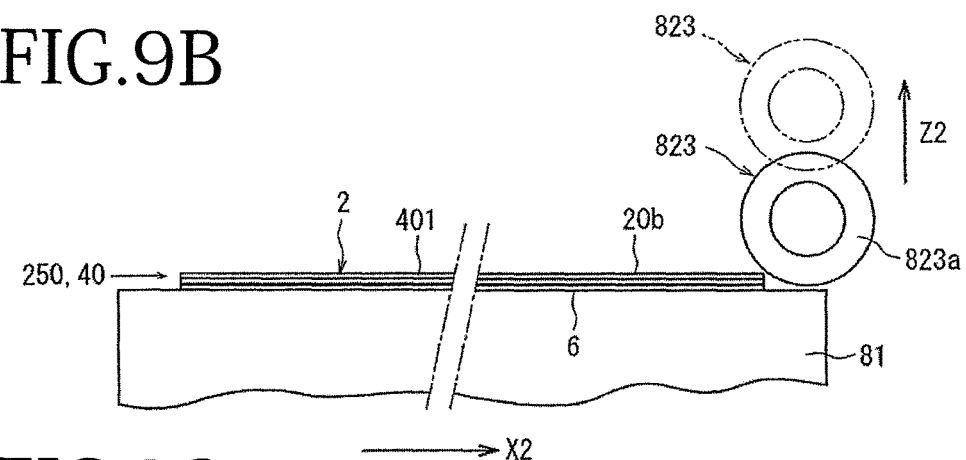
Figures 9C, 9D:
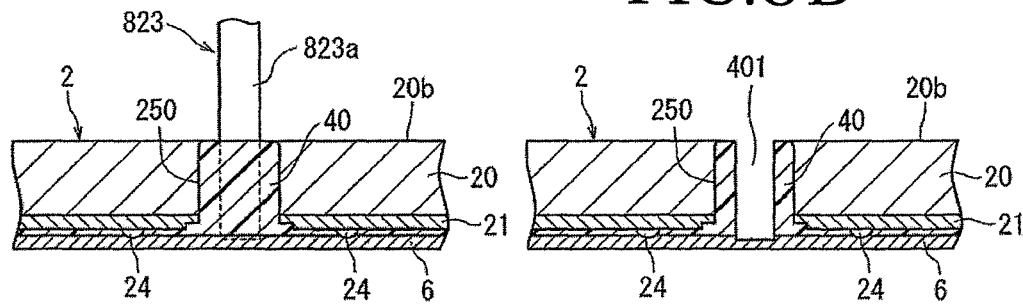

After the semiconductor wafer 2 held on the chuck table 81 of the cutting apparatus 8 is thus positioned at the cutting starting position of the cutting region, the cutting blade 823 is put to cutting-in feed downward as indicated by arrow Z1 from a stand-by position indicated by alternate long and two short dashes line in FIG. 9A, and is positioned at a predetermined cutting-in feed position as indicated by solid line in FIG. 9A. The cutting-in feed position is set in such a manner that a lower end of the annular cutting edge 823a of the cutting blade 823 reaches the protective tape 6 attached to the front side of the molding resin 40 laid on the front side 21a of the functional layer 21 constituting the semiconductor wafer 2 as shown in FIGS. 9A and 9C.

Next, the cutting blade 823 is rotated at a predetermined rotating speed in a direction indicated by arrow 822a in FIG. 9A, and the chuck table 81 is moved at a predetermined cutting feed speed in a direction indicated by arrow X1 in FIG. 9A. Then, when the other end (the right end in FIG. 9B) of the molding resin 40 embedded in the laser-processed groove 250 has reached a position spaced by a predetermined amount to the left side from a position just under the annular cutting edge 823a of the cutting blade 823, the movement of the chuck table 81 is stopped. With the chuck table 81 put to cutting-in feed in this manner, the molding resin 40 embedded in the laser-processed groove 250 and the molding resin 40 laid on the front side 2a of the semiconductor wafer 2 are completely cut by a division groove 401 which reaches the protective tape 6 and has a width of 20 µm, as illustrated in FIG. 9D (dividing step).

As has been described above, in this dividing step, a center in the width direction of the molding resin 40 embedded in the laser-processed groove 250 having a width of 60 µm, which is wider by 20 µm than the width (40 µm) of the cut groove formed along the division line 22 by a conventional processing method, is cut along the laser-processed groove 250 by the cutting blade 823. Therefore, even when a cutting blade limited in width to a value of not less than 20 µm is used, the molding resin is present in a width of approximately 20 µm at each location between a side surface of the cutting blade and a side surface of the device chip. For this reason, the side surfaces of the device chips are not damaged.

Subsequently, the cutting blade 823 is raised as indicated by arrow Z2 in FIG. 9B to be positioned at a stand-by position indicated by alternate long and two short dashes line, and the chuck table 81 is moved in a direction indicated by arrow X2 in FIG. 9B, to be returned to the position shown in FIG. 9A. Then, the chuck table 81 is put to indexing feed in a direction (indexing feed direction) perpendicular to the paper surface by an amount corresponding to the interval of the laser-processed grooves 250 in which the molding resin 40 is embedded (the interval of the division lines 22), whereby the molding resin 40 embedded in the laser-processed groove 250 to be cut next is positioned at a position corresponding to the cutting blade 823. After the molding resin 40 embedded in the laser-processed groove 250 to be cut next is positioned at the position corresponding to the cutting blade 823 in this manner, the above-mentioned dividing step is carried out. Then, the dividing step is applied to the molding resin 40 embedded in all the laser-processed grooves 250 formed in the substrate 20 constituting the semiconductor wafer 2.

After the dividing step as above is conducted, a wafer supporting step is carried out in which the back side of the semiconductor wafer 2 is attached to a front side of a dicing tape having a peripheral portion mounted such as to cover an inside opening of an annular frame, and the protective member attached to the front side of the molding resin 40 laid on the front side 21a of the functional layer 21 of the semiconductor wafer 2 is released. Specifically, as depicted in FIG. 10A, the back side 20b of the substrate 20 of the semiconductor wafer 2 having undergone the above-mentioned dividing step is attached to the front side of a dicing tape T whose peripheral portion is mounted such as to cover an inside opening of an annular frame F. Then, the protective tape 6 as the protective member attached to the front side of the molding resin 40 laid on the front side 21a of the functional layer 21 constituting the semiconductor wafer 2 is released. Therefore, of the semiconductor wafer 2 attached to the front side of the dicing tape T, the molding resin 40 laid on the front side 21a of the functional layer 21 is situated on the upper side. The semiconductor wafer 2 having been subjected to the wafer supporting step in this way is carried to a picking-up step (which is a subsequent step), for picking up device chips 25 individually. Each of the device chips 25 picked up in this manner constitutes a wafer level chip size package (WL-CSP) in which a front side and side surfaces are coated with the molding resin 40 as depicted in FIG. 11.

Note that while an example in which the wafer supporting step is applied to the semiconductor wafer 2 having undergone the dividing step has been shown in the above embodiment, a method may be adopted in which the wafer supporting step is applied to the semiconductor wafer 2 having undergone the above-mentioned back grinding step, and thereafter a center in the width direction of the molding resin 40 embedded in the laser-processed grooves 250 is cut from the front side 2a of the semiconductor wafer 2 attached to the front side of the dicing tape T, to form the wafer level chip size packages (WL-CSP).

Now, a second embodiment of the wafer processing method according to the present invention will be described below, referring to FIGS. 12 to 15C. In the second embodiment, also, first, the groove forming step, the molding step and the bump exposing step in the first embodiment above are performed similarly.

Next, a cut groove forming step is performed in which a central potion in the width direction of the molding resin 40 laid on the front side 2a of the semiconductor wafer 2 and the molding resin 40 embedded in the laser-processed grooves 250 is cut along the laser-processed grooves 250 from the front side 2a of the semiconductor wafer 2 by a cutting blade having a thickness smaller than the width of the laser-processed grooves 250, to form cut grooves 402 having a depth corresponding to the finished thickness of the device chips. The cut groove forming step is carried out by use of the cutting apparatus 8 depicted in FIG. 8.

Figure 8:
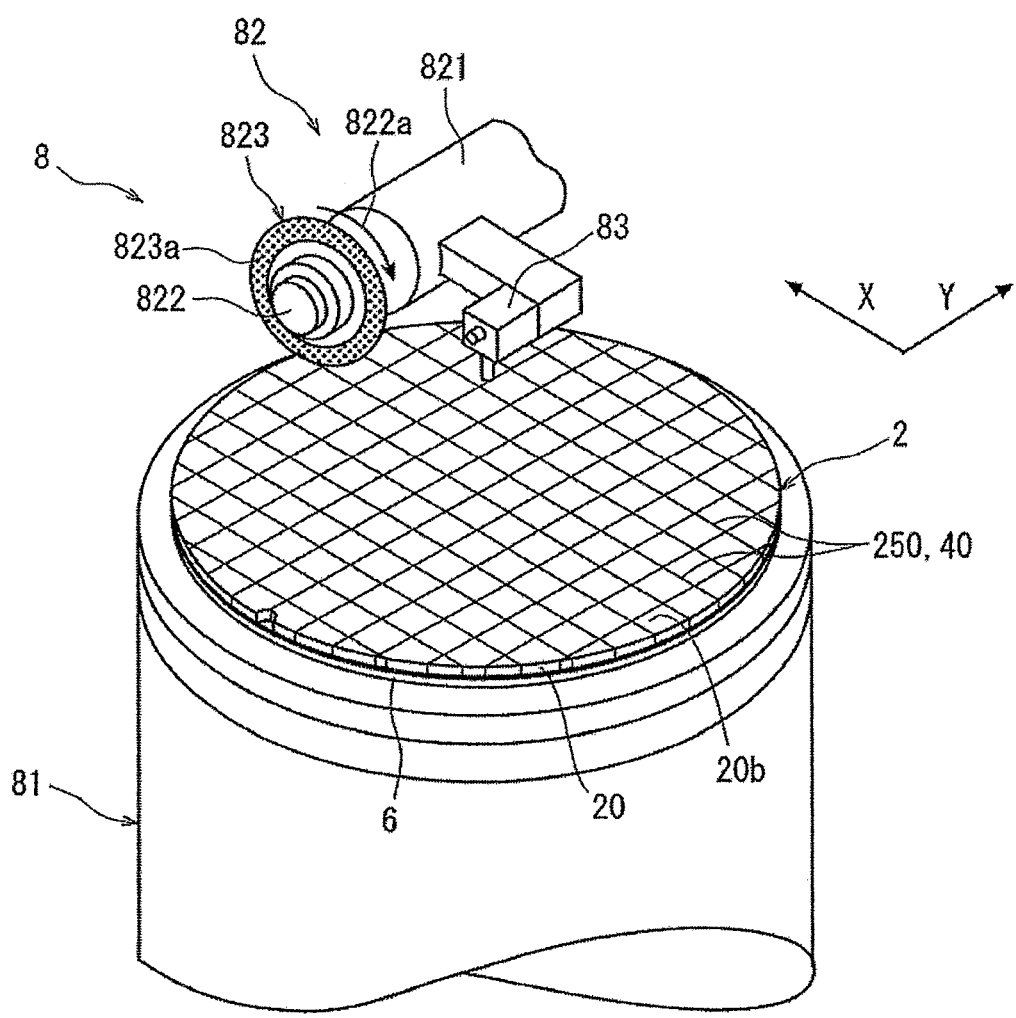
FIG. 8 is a major part perspective view of a cutting apparatus for carrying out a dividing step.
Figure 12:
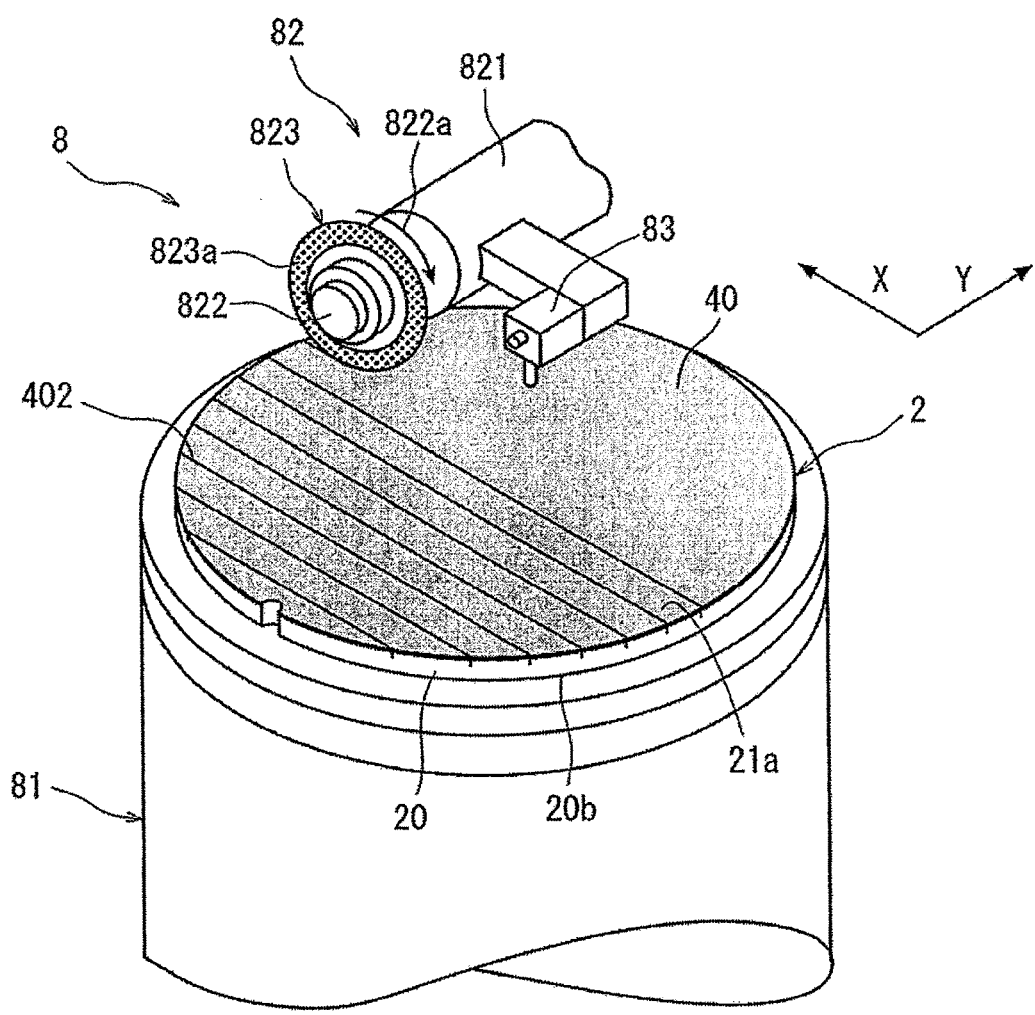
FIG. 12 is a major part perspective view of a cutting apparatus for executing a cut groove forming step.

In performing the cut groove forming step by use of the cutting apparatus 8 shown in FIG. 8, the substrate 20 constituting the semiconductor wafer 2 having been subjected to the groove forming step, the molding step and the bump exposing step in the first embodiment is placed on the chuck table 81, with its back side 20b facing down, as illustrated in FIG. 12. Then, suction means (not shown) is operated, to thereby hold the semiconductor wafer 2 on the chuck table 81 by suction. Therefore, of the semiconductor wafer 2 held on the chuck table 81, the molding resin 40 laid on the front side 21a of the functional layer 21 is situated on the upper side. The chuck table 81 with the semiconductor wafer 2 thus suction held thereon is positioned at a position just under the imaging means 83 by the cutting feeding means (not shown).

After the chuck table 81 is positioned just beneath the imaging means 83, an alignment operation is performed in which a cutting region where a central portion in the width direction of the molding resin 40 laid on the front side 21a of the functional layer 21 of the semiconductor wafer 2 and the molding resin 40 embedded in the laser-processed grooves 250 is to be cut along the laser-processed grooves 250 so as to form cut grooves having a depth corresponding to the finished thickness of the device chips is detected by the imaging means 83 and the control means (not shown). Specifically, the imaging means 83 and the control means (not shown) perform image processing for positional matching between the molding resin 40 embedded in the laser-processed groove 250 formed in the first direction of the semiconductor wafer 2 and the cutting blade 823, to thereby perform alignment of the cutting region (alignment step). Note that since in this embodiment the molding resin 40 is laid on the front side 21a of the functional layer 21 of the semiconductor wafer 2 formed with the laser-processed grooves 250, the imaging means 83 images the bumps 24 which are formed in the devise 23 adjacent to each other with the division line 22 therebetween and which are being exposed from the front side of the molding resin 40, and the imaging means 83 sends an image signal to the control means (not shown). Then, the control means (not shown) determines a middle position between the bumps 24 and the bumps 24 which are formed in the adjacent devices 23 as a middle position in the width direction of the laser-processed groove 250 formed along the division line 22. After the alignment for the laser-processed groove 250 which is formed in the first direction of the semiconductor wafer 2 and in which the molding resin 40 is embedded is performed in this manner, the alignment of the cutting region is carried out similarly also for the laser-processed groove 250 formed in the second direction orthogonal to the first direction of the semiconductor wafer 2.

After the alignment for detecting the cutting region of the molding resin 40 laid on the front side 21a of the functional layer 21 of the semiconductor wafer 2 held on the chuck table 81 and the molding resin 40 embedded in the laser-processed grooves 250 is conducted in this manner, the chuck table 81 with the semiconductor wafer 2 held thereon is moved to a cutting starting position of the cutting region. In this instance, as shown in FIG. 13A, the semiconductor wafer 2 is positioned in such a manner that one end (the left end in FIG. 13A) of the molding resin 40 embedded in the laser-processed groove 250 to be cut is positioned at a position spaced by a predetermined amount to the right side from a position just under the annular cutting edge 823a of the cutting blade 823.

Figure 13A:
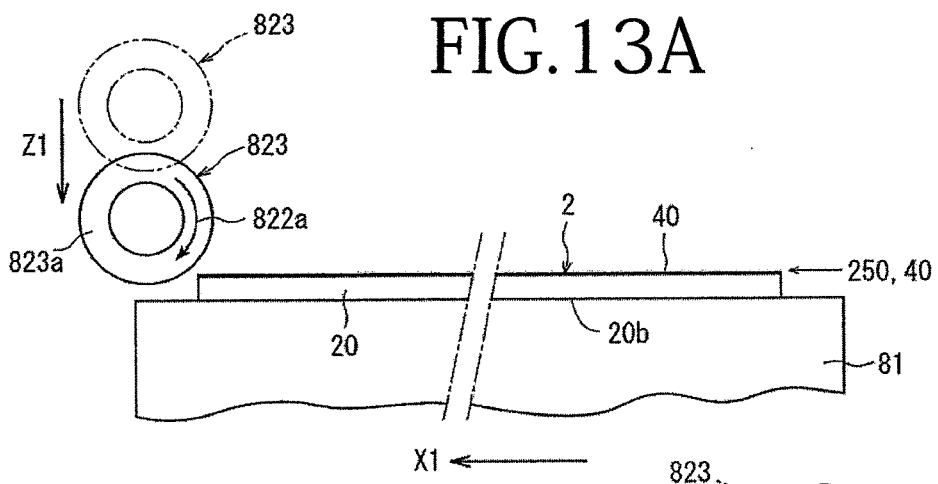
FIGS. 13A to 13D are illustrations of the cut groove forming step.

After the semiconductor wafer 2 held on the chuck table 81 of the cutting apparatus 8 is thus positioned at the cutting starting position of the cutting region, the cutting blade 823 is put to cutting-in feed downward as indicated by arrow Z1 from a stand-by position indicated by alternate long and two short dashes line in FIG. 13A, to be positioned at a predetermined cutting-in feeding position as indicated by solid line in FIG. 13A. This cutting-in feeding position is set in such a manner that a lower end of the annular cutting edge 823a of the cutting blade 823 reaches a bottom surface of the laser-processed groove 250 formed in the substrate 20 constituting the semiconductor wafer 2 in the depth corresponding to the finished thickness of the device chips, as depicted in FIG. 13C.

Subsequently, the cutting blade 823 is rotated at a predetermined rotating speed in a direction indicated by arrow 822a in FIG. 13A, and the chuck table 81 is moved at a predetermined cutting feed speed in a direction indicated by arrow X1 in FIG. 13A. Then, when the other end (the right end in FIG. 13B) of the molding resin 40 embedded in the laser-processed groove 250 has reached a position spaced by a predetermined amount to the left side from a position just beneath the annular cutting edge 823a of the cutting blade 823, the movement of the chuck table 81 is stopped. With the chuck table 81 put to cutting feed in this way, a cut groove 402 having a width of 20 µm and reaching the bottom surface of the laser-processed groove 250 is formed in the molding resin 40 laid on the front side 2a of the semiconductor wafer 2 and the molding resin 40 embedded in the laser-processed groove 250, as depicted in FIG. 13D (cut groove forming step).

Figure 13B:
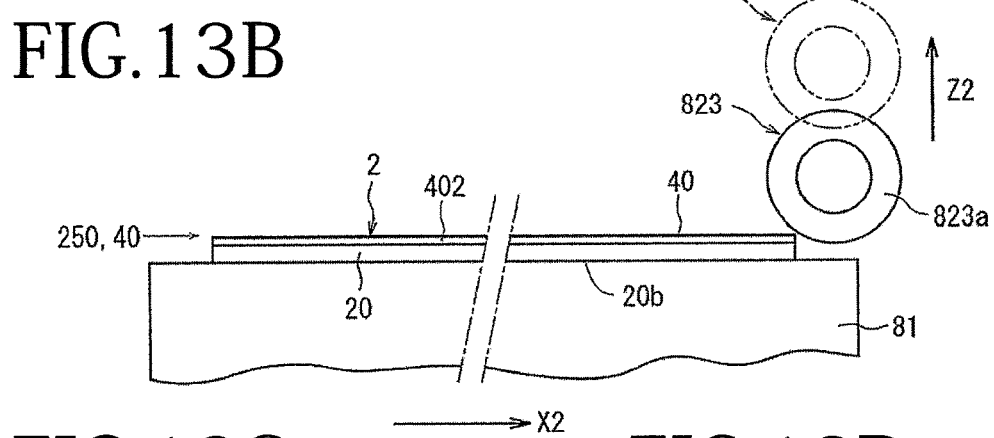
Figures 13C, 13D:
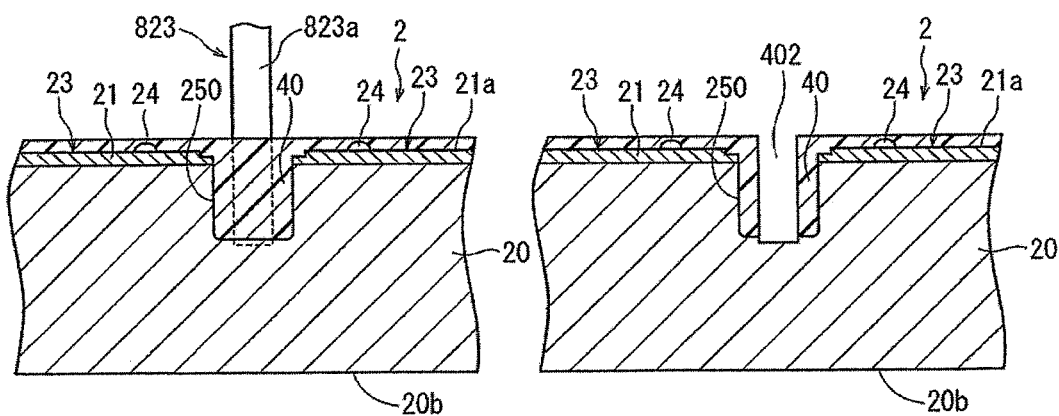

Next, the cutting blade 823 is raised as indicated by arrow Z2 in FIG. 13B to be positioned at a stand-by position indicated by alternate long and two short dashes line, and the chuck table 81 is moved in a direction indicated by arrow X2 in FIG. 13B, to be return to the position shown in FIG. 13A. Then, the chuck table 81 is put to indexing feed in a direction perpendicular to the paper surface (indexing feed direction) by an amount corresponding to the interval of the laser-processed grooves 250 in which the molding resin 40 is embedded (the interval of the division lines 22), whereby the molding resin 40 embedded in the laser-processed groove 250 to be cut next is positioned at a position corresponding to the cutting blade 823. After the molding resin 40 embedded in the laser-processed groove 250 to be cut next is positioned at the position corresponding to the cutting blade 823, the aforementioned cut groove forming step is performed. Then, the above-mentioned cut groove forming step is carried out for all the molding resin 40 laid on the front side 21a of the functional layer 21 of the semiconductor wafer 2 and the molding resin 40 embedded in the laser-processed grooves 250.

Figure 14A:
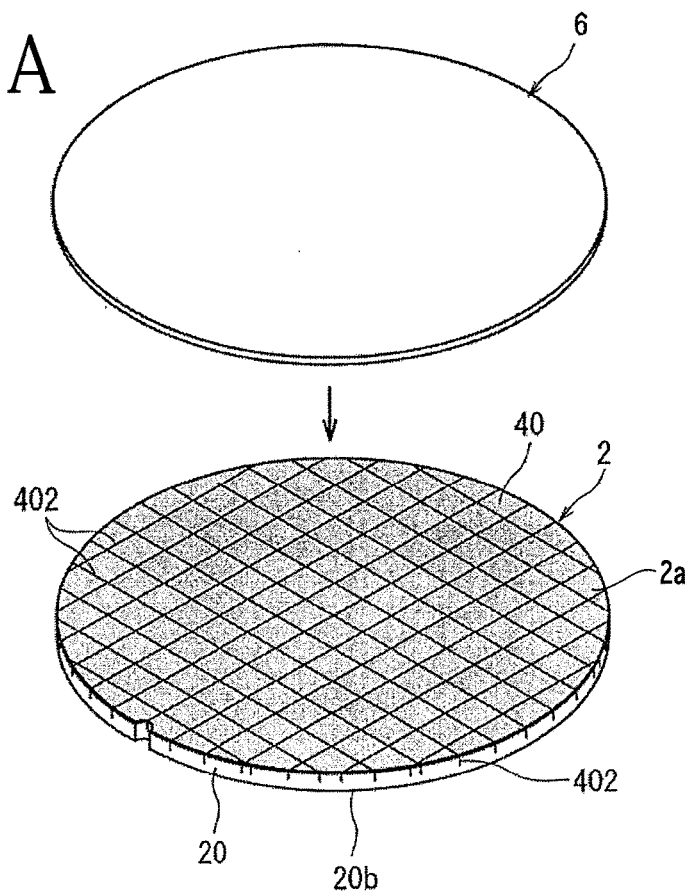
FIGS. 14A and 14B are illustrations of another embodiment of the protective member attaching step.
Figure 14B:
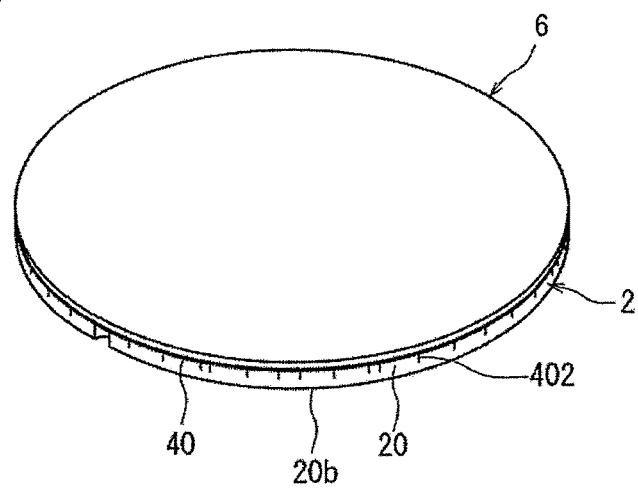

After the cut groove forming step as above is conducted, a protective member attaching step is performed in which a protective member is attached to the front side of the molding resin 40 laid on the front side 2a of the semiconductor wafer 2. Specifically, as illustrated in FIGS. 14A and 14B, the protective tape 6 as a protective member is attached to the front side of the molding resin 40 laid on the front side 2a of the semiconductor wafer 2 which has been subjected to the cut groove forming step. Note that the protective tape 6 has an acrylic resin adhesive applied in a thickness of approximately 5 µm to a front side of a sheet-shaped base material of PVC having a thickness of 100 µm, like in the embodiment illustrated in FIG. 6 above.

Next, a back grinding step is performed in which the back side 20b of the substrate 20 constituting the semiconductor wafer 2 having undergone the protective member attaching step is ground, to expose the molding resin 40 embedded in the laser-processed grooves 250 to the back side 20b of the substrate 20 constituting the semiconductor wafer 2 and thereby to divide the semiconductor wafer 2 into individual device chips 25 each having a periphery surrounded with the molding resin 40. The back grinding step can be carried out by use of the grinding apparatus 7 shown in FIG. 7 above.

Figure 15A:
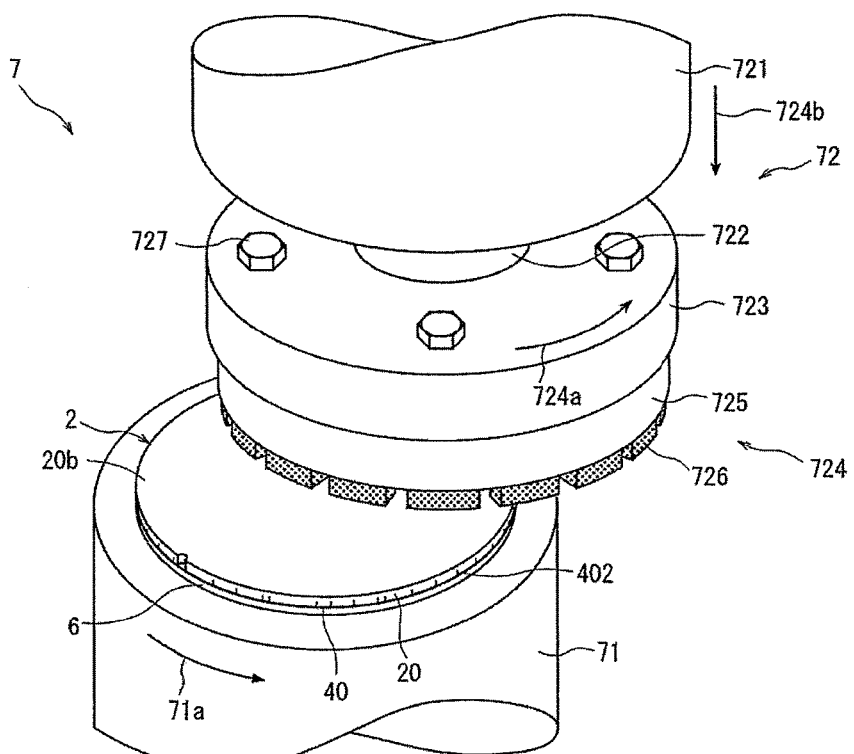
FIGS. 15A to 15C are illustrations of another embodiment of the back grinding step.
Figure 15B:
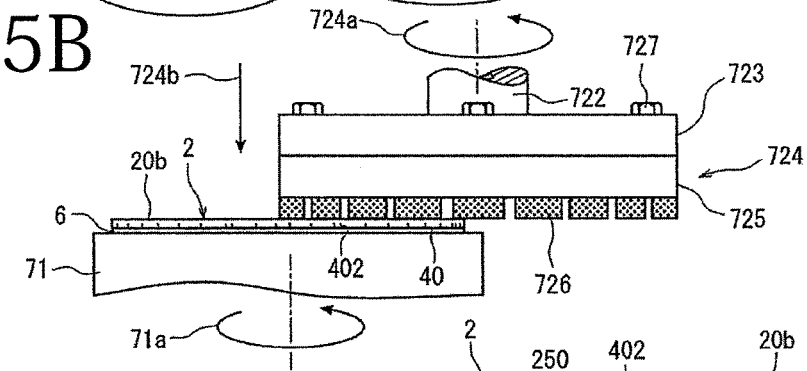
Figure 15C:
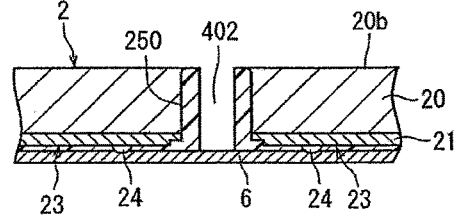

In performing the back grinding step by use of the grinding apparatus 7, the semiconductor wafer 2 having been subjected to the protective member attaching step is placed on an upper surface (holding surface) of the chuck table 71, with its protective tape 6 side facing down, as depicted in FIG. 15A. Then, suction means (not shown) is operated, whereby the semiconductor wafer 2 is suction held on the chuck table 71 through the protective tape 6. Therefore, of the semiconductor wafer 2 held on the chuck table 71, the back side 20b of the substrate 20 is situated on the upper side. After the semiconductor wafer 2 is suction held on the chuck table 71 through the protective tape 6 in this way, the chuck table 71 is rotated, for example, at 300 rpm in a direction indicated by arrow 71a in FIG. 15A. In this condition, the grinding wheel 724 of the grinding means 72 is rotated, for example, at 6,000 rpm in a direction indicated by arrow 724a in FIG. 15A, the grindstones 726 are brought into contact with the back side 20b of the substrate 20 constituting the semiconductor wafer 2 which is a surface to be processed, as depicted in FIG. 15B, and the grinding wheel 724 is put to grinding feed by a predetermined amount downward (in a direction perpendicular to the holding surface of the chuck table 71) at a grinding feed rate of, for example, 1 μm/second, indicated by arrow 724b in FIGS. 15A and 15B. As a result, the back side 20b of the substrate 20 constituting the semiconductor wafer 2 is ground, whereby the laser-processed grooves 250 are exposed to the back side 20b of the substrate 20 constituting the semiconductor wafer 2, and the molding resin 40 embedded in the laser-processed grooves 250 is exposed to the back side 20b of the substrate 20 constituting the semiconductor wafer 2, as illustrated in FIG. 15C. Consequently, the semiconductor wafer 2 is divided into individual device chips 25 each having a periphery surrounded with the molding resin 40.

Figure 10:
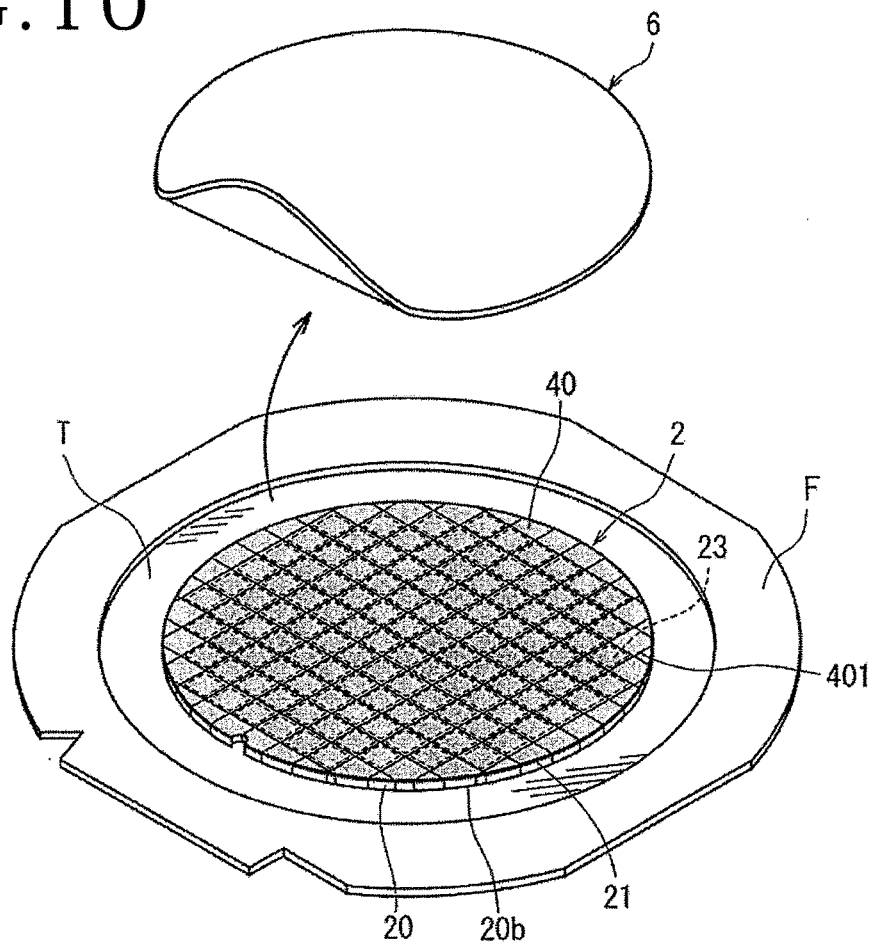
FIG. 10 is an illustration of a wafer supporting step.
Figure 11:
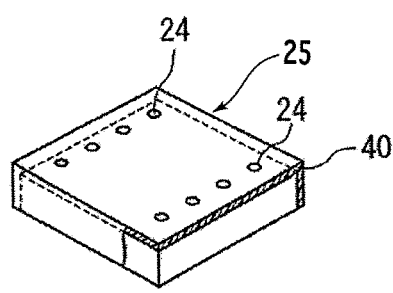
FIG. 11 is a perspective view of one of individually divided devices.

After the back grinding step is conducted in this manner, the back side 20b of the substrate 20 constituting the semiconductor wafer 2 having undergone the above-mentioned back grinding step is attached to the front side of the dicing tape T having a peripheral portion mounted such as to cover the inside opening of the annular frame F, like in the wafer supporting step shown in FIG. 10 above. Then, the protective tape 6 as the protective member adhered to the front side of the molding resin 40 laid on the front side 21a of the functional layer 21 of the semiconductor wafer 2 is released, the semiconductor wafer 2 is fed to a picking-up step which is a subsequent step, and the device chips 25 are picked up individually. Each of the device chips 25 picked up in this way constitutes the wafer level chip size package (WL-CSP) having a front side and side surfaces coated with the molding resin 40, as shown in FIG. 11.

While the present invention has been described above on the basis of the embodiments illustrated in the drawings, the invention is not to be limited only to the aforementioned embodiments, and various modifications are possible within the scope of the gist of the invention. For instance, while an example has been shown in the aforementioned embodiments in which a semiconductor wafer 2 composed of a substrate 20 of silicon or the like and a functional layer 21 which is formed on the front side 20a of the substrate 20 and in which an insulation film composed of a low-permittivity insulator film (low-k film) and a functional film for forming a circuit are stacked is processed as a wafer, the invention produces the same advantageous effect also when applied to wafers of other configurations.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for processing a wafer having a plurality of division lines formed in a crossing pattern on a front side thereof and having devices formed in a plurality of regions partitioned by the division lines, the devices being each provided with a plurality of bumps formed on a front side thereof, the wafer processing method comprising:
   a groove forming step of applying a laser beam of such a wavelength as to be absorbed in the wafer from the front side of the wafer along a full length of each of the division lines, to form along each of the division lines grooves having a depth corresponding to a finished thickness of device chips;
   a molding step of laying a molding resin on the front side of the wafer and embedding the molding resin in the grooves, wherein the molding step is performed after the groove forming step;
   a protective member attaching step of attaching a protective member to a front side of the molding resin laid on the front side of the wafer having been subjected to the molding step;
   a back grinding step of grinding a back side of the wafer to expose the grooves and to expose the molding resin embedded in the grooves to the back side of the wafer, wherein the back grinding step is performed after the protective member attaching step; and
   a dividing step of cutting, by a cutting blade having a thickness smaller than a width of the grooves, a central portion in a width direction of the molding resin exposed along the grooves, along the grooves, thereby to divide the wafer into individual device chips each having a periphery surrounded with the molding resin.

2. The wafer processing method according to claim 1, wherein the dividing step includes cutting the central portion in the width direction of the molding resin exposed along the grooves by the cutting blade along the grooves from the back side of the wafer.

3. The wafer processing method according to claim 1, further comprising, before performing the dividing step, a wafer supporting step of attaching the back side of the wafer having been subjected to the back grinding step to a front side of a dicing tape an outer peripheral portion of which is mounted such as to cover an inside opening of an annular frame, and releasing the protective member attached to the front side of the molding resin laid on the front side of the wafer.

4. A wafer processing method for processing a wafer having a plurality of division lines formed in a crossing pattern on a front side thereof and having devices formed in a plurality of regions partitioned by the division lines, the devices being each provided with a plurality of bumps formed on a front side thereof, the wafer processing method comprising:
   a groove forming step of applying a laser beam having such a wavelength as to be absorbed in the wafer from the front side of the wafer along a full length of each of the division lines, to form along the each of division lines grooves having a depth corresponding to a finished thickness of device chips;
   a molding step of laying a molding resin on the front side of the wafer and embedding the molding resin in the grooves, wherein the molding step is performed after the groove forming step;
   a cut groove forming step of cutting, by a cutting blade having a thickness smaller than a width of the grooves, a central portion in a width direction of the molding resin laid on the front side of the wafer along the grooves from the front side of the wafer, to form cut grooves having a depth corresponding to the finished thickness of the device chips, wherein the cut groove forming step is performed after the molding step;
   a protective member attaching step of attaching a protective member to a front side of the molding resin laid on the front side of the wafer having been subjected to the cut groove forming step; and
   a back grinding step of grinding a back side of the wafer having been subjected to the protective member attaching step, to expose the molding resin embedded in the grooves and the cut grooves to the back side of the wafer and thereby to divide the wafer into individual device chips each having a periphery surrounded with the molding resin.

5. The wafer processing method according to claim 4, further comprising a wafer supporting step of attaching the back side of the wafer having been subjected to the back grinding step to a front side of a dicing tape an outer peripheral portion of which is mounted such as to cover an inside opening of an annular frame, and releasing the protective member attached to the front side of the molding resin laid on the front side of the wafer.

6. The wafer processing method according to claim 1, wherein said molding step includes covering the plurality of bumps with the molding resin.

7. The wafer processing method according to claim 6, further comprising:
   a bump exposing step of exposing the bumps by using a polishing means to remove relevant portions of the molding resin to expose the bumps, wherein the bump exposing step is performed after performing the molding step and before the protective member attaching step.

8. The wafer processing method according to claim 4, wherein said molding step includes covering the plurality of bumps with the molding resin.

9. The wafer processing method according to claim 8, further comprising:
   a bump exposing step of exposing the bumps by using a polishing means to remove relevant portions of the molding resin to expose the bumps.

10. The wafer processing method according to claim 1, wherein the groove forming step includes applying the laser beam multiple times along each of the division lines.

11. The wafer processing method according to claim 1, wherein the groove forming step includes applying the laser beam three times along each of the division lines.

12. The wafer processing method according to claim 4, wherein the groove forming step includes applying the laser beam multiple times along each of the division lines.

13. The wafer processing method according to claim 4, wherein the groove forming step includes applying the laser beam three times along each of the division lines.

14. The wafer processing method according to claim 1, wherein said individual device chips each include a functional layer and a substrate, and further wherein the molding resin covers the periphery of both the substrate and the functional layer.

15. The wafer processing method according to claim 4, wherein said individual device chips each include a functional layer and a substrate, and further wherein the molding resin covers the periphery of both the substrate and the functional layer.

* * * * *